United States Patent [19]

Bartlett et al.

[11] 3,764,857

[45] Oct. 9, 1973

[54] CABINET FOR INTERCHANGEABLE CIRCUIT BOARDS

[75] Inventors: Peter G. Bartlett; Donald E. Henry, both of Davenport; Kenton L. Riceman, Bettendorf, all of Iowa

[73] Assignee: Struthers-Dunn Inc., Pitman, N.J.

[22] Filed: May 31, 1972

[21] Appl. No.: 258,284

[52] U.S. Cl..... 317/101 DH, 339/17 LC, 340/324 R

[51] Int. Cl. .............................................. H05k 5/03

[58] Field of Search .................. 317/101 C, 101 CB, 317/101 CC, 101 D, 101 DH, 118; 339/17 D, 17 LC, 17 LM, 17 M; 340/225, 324 R

[56] References Cited

UNITED STATES PATENTS

| | | | |
|---|---|---|---|
| 3,375,408 | 3/1968 | Buhrendorf | 317/101 CB |
| 3,681,665 | 8/1972 | Olds | 317/101 CC |
| 3,631,299 | 12/1971 | Meyer | 317/101 DH |
| 3,017,232 | 1/1962 | Schwab | 317/101 DH |
| 3,001,171 | 9/1961 | Schultz | 317/101 DH |
| 3,165,728 | 1/1965 | Finney | 340/324 R |

*Primary Examiner*—J. V. Truhe
*Assistant Examiner*—Gerald P. Tolin
*Attorney*—William D. Hall et al.

[57] ABSTRACT

The disclosure relates to a cabinet with replaceable and removable circuit boards. The cabinet is provided with a plurality of circuit boards, each of the circuits being provided with indicating means for identifying the input for and output from the circuit. Means are provided on the interior of the cabinet for aligning the circuit boards as they are inserted into the cabinet and locking them in place to insure correct alignment and contact between the circuit board and its electrical bus connector.

15 Claims, 3 Drawing Figures

CABINET FOR INTERCHANGEABLE CIRCUIT BOARDS

BACKGROUND OF THE INVENTION

This application relates to improvements in a cabinet for electronic circuitry. Specifically, it relates to a cabinet having a plurality of individual and removable circuit boards. Means are provided for aligning the boards within the cabinet to insure correct alignment with the bus connectors which connect the boards electrically.

At the present time, most electronic devices employ one or more circuit boards in the electronic circuitry of the device. In many electronic devices, such as modern computers, the device consists almost entirely of circuit boards with only connective or bus wiring. The greatest percentage of labor required to assemble a modern electronic device is the wiring labor required to interconnect the circuit boards with one another. Although the use of circuit boards may save literally miles of wiring in a large electronic device, it still requires extensive in and out wiring, together with any associated wiring employed to provide an indication of the circuit's state of being.

If it is desired to provide a plurality of indicating means for the circuits, one side of the circuit board will be used to provide the wiring connections to the indicating means, the second side of the board will be used to provide the wiring connections for the input circuits, and still a third side of the board will be used to provide wiring connections for the output circuits. Changing a circuit board because of electrical breakdown is a time consuming and costly process. Each of the wires must be unsoldered from the old board and resoldered to the new, and with a large number of wires, the possibility for human error in the interconnection of the wiring bus is very large.

In the construction of modern-day electronic devices which have a plurality of capabilities, it is often desired to add electronic capability to the device which requires the addition or change of a given circuit board. Again, a great number of individual wiring connections must be made between the new circuit board and the existing circuitry.

One example of an area in which changes are necessary is the field of process control systems. Here, the prior art has relied on cumbersome, bulky relay systems, solid state logic control systems and modern high speed digital computers. In each case, once the program is set for the process control, it is virtually impossible to change the program without a great deal of rewiring for the relay and solid state control systems or a great deal of expense in software programming for the high speed digital computers. One of the drawbacks present in each of the above systems is that a predetermined number of input and output registers are provided (often an unequal number of each) and it is thus difficult to accomodate a system to a specific situation where, for example, a large number of input registers is required but only a small number of output registers is required. Other process control computers of the prior art employ a read only memory which stores a predetermined program. In these systems however, the memory is often of the type which cannot be altered so as to change the program, with the result that the only alternative then is to provide a completely new memory for the system. In other similar memories changes to the program can be made only with considerable difficulty and often only with the purchase of quite expensive new equipment. This is particularly true with those memories which use magnetic cores since the stored memory can ordinarily be changed only by the use of quite complicated and expensive apparatus.

Even after an electronic system has been assembled within a cabinet, it is often highly desirable to have a visual display of the circuit inputs and outputs, since the electronic system may be performing a large number of independently variable functions, or may be receiving or sending information from or to a large number of independently variable inputs or outputs. While it is common to provide panel display lamps to provide this visual indication, the panel display lamps are normally individually wired to the circuit board outputs. Thus if it is found necessary to change the number of circuit inputs, or circuit outputs, it is necessary to individually rewire each of the panel display lamps to accomodate the additional functions or displays. The cost of these wiring changes can be prohibitive if a great number of functional changes are involved. Additionally, each of the individual panel lights must be separately identified to enable the tracing of inputs and outputs during the testing or trouble-shooting modes of operation. Again, in the prior art when individually wired panel lights are used, a separate identification number must be assigned to each individual lamp as that lamp is wired in place.

SUMMARY OF THE INVENTION

It is therefore an object of the present invention to provide a cabinet for electronic circuitry with a plurality of circuit boards whereby the number of circuit boards may be changed at will. It is a further object to provide means for changing the number of functions or the number of input or output devices controlled by the electronic circuitry. It is a further object of the invention to provide an integral signal lamp circuit with each of the circuits to avoid the costly and expensive hand-wiring of the individual panel lights. It is another object of the invention to provide registration means to guide the circuit boards into the cabinet and to lock them securely in place with their appropriate bus connector. It is another object of the invention to provide identifying means for each of the signal lamps associated with the circuit boards.

In the present invention, a plurality of circuit boards are mounted on removable cards which are slid into the cabinet and locked in place. A row of signal lamps is arranged vertically on the frontal edge of the board, and means are provided on the cabinet to insure the proper registration of the board within the cabinet. This registration is necessary to provide for the proper bus connections between the bus connector and the circuit board.

In one embodiment of the present invention, a process control computer may be provided with removable register or memory cards which may be slid into place as desired. Thus the computer may be changed or adapted to any number of a wide variety of process control situations merely by replacing the memory cards and installing the appropriate number of input or output register cards. There is no expensive rewiring required, and it is only necessary to set up the program and to store the program in the memory cards in order to adapt the process control computer from one process to another.

DESCRIPTION OF THE PREFERRED EMBODIMENT

Figures 2, 3:
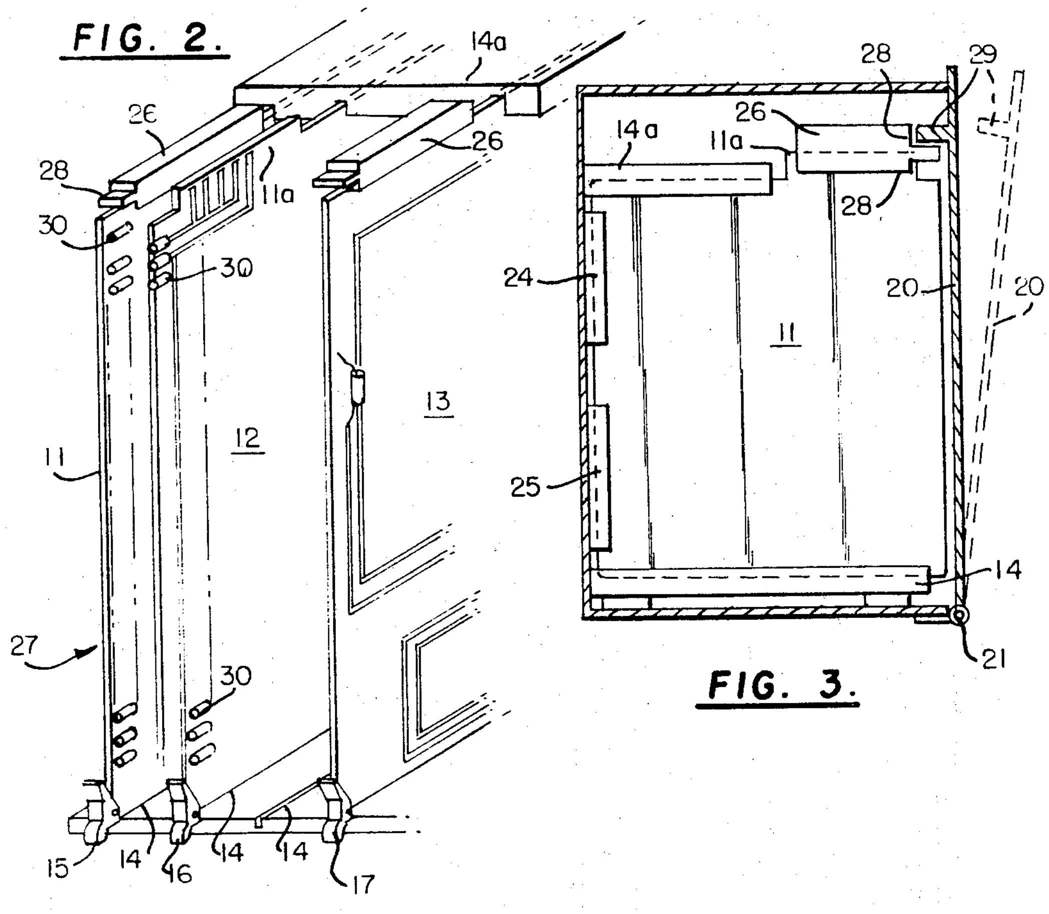
FIG. 2 is an isometric view of a plurality of circuitry boards installed within a cabinet.
FIG. 3 is a cross-sectional side view illustrating the cabinet, the circuit boards, the registration means, and its cooperation with the circuit board and electrical bus connector.

In the cabinet of the present invention, the individual circuits are mounted on replaceable and removable circuit boards as illustrated in FIG. 2. Each of the circuit boards is slidably engaged in a plurality of tracks 14, 14*a* mounted respectively in the lower and the upper portion of the cabinet. Each lower track 14 preferably extends the full depth of the cabinet, but each upper track extends only approximately one-half the depth of the cabinet so as to permit connector 26 to be coupled to the front part of the top edge of each board. These tracks are aligned perpendicularly to the frontal face of the cabinet. The cards are initially secured in place by means of the ejectors 15, 16 and 17 illustrated in FIG. 2, and by means of a locking bar 29 illustrated in FIG. 3.

The front of the cabinet comprises a hinged panel 20 which is affixed to the cabinet by means of a hinge 21 and panel locks 22 and 23. The frontal portion of the cabinet opens outwardly and downwardly as illustrated by the dotted line illustrated in FIG. 3.

As illustrated in FIG. 3, the circuit board 11 is connected to the other circuit boards and to external input and outputs by means of input bus connectors 24 and 25 and an output bus connector 26. In the connectors of the preferred embodiment, the female connectors are mounted on the card or circuit board and are gold-plated with enclosed and bifurcated contacts. The male connectors are mounted in the connector blocks 24, 25 and 26, and are also gold-plated and completely recessed to avoid and eliminate any problems with handling. This is necessary since through handling, the contact surfaces can become contaminated and corroded due to the deposits of skin oils and acids which would result in poor contact. Through the use of the connector blocks 24, 25 and 26, it is no longer necessary to rewire the electronic device when it is desired to repair or add additional circuit capacity. If additional circuits are desired, an additional circuit board is installed and the appropriate connector blocks are fitted over the contacts.

The precise alignment of the connector buses or connector blocks has always presented a problem. In the present invention, the problem is solved by the precise registration or alignment of the circuit board 11. The tracks 14 and 14a prevent the circuit boards from moving in a direction transverse to the plane defined by the circuit board. When a card is originally installed, the front panel 20 is lowered as illustrated in FIG. 3, and the circuit board 11 is slid into the cabinet in tracks 14, 14*a* in the direction indicated by arrow 27 in FIG. 2. At the rear of the cabinet, female connectors on the rear edge of the card connect with male pins on the connector blocks 24 and 25 which are fitted to the circuit board, and connector block 26 is brought down from above and fitted over an upstanding portion 11*a* of the circuit board. The connector block 26 defines a cut-out portion 28 illustrated in FIGS. 2 and 3. This cut-out portion receives block 29 secured to the front panel of the cabinet. As the front panel is restored to its normal position as illustrated in FIG. 3, the locking bar 29 fits into the notch defined in the connector block 26, and secures both connector 26 and circuit board 11 against any vertical movement or against any longitudinal movement in the direction of the longitudinal track 14. Since track 14 secures the card against any transverse movement, the register card is securely locked in place and prevented from moving in any one of the three directions of movement.

The inter fit of the locking bar 29 within the notch 28 defined within the connector block 26 also assists in the proper location and registration of the connector block 26 upon the circuit board 11. This insures a correct electrical connection between the connector block 26 and the circuit card 11.

Each of the circuit boards 11 and 12 has arranged on the frontal face of the board a plurality of indicating means 30. In one embodiment of the invention, these indicating means are light-emitting diodes, and there is a diode for each of the input and output circuits. Thus, when it is desired to verify a circuit which has been entered via one of the circuit boards 13, it may be verified by applying a given input, and watching for an appropriate response in the output indicating means 30. If the electronic device or its associated circuitry is malfunctioning, the indicating means 30 provide one method of isolating the malfunction. Since each of the lights will be assigned a given function, it is relatively easy to ascertain when a desired result is obtained in response to a given input.

Front panel 20 is equipped with a plurality of openings 31 which are so arranged as to correspond with the location of the indicating means 30. When the front panel 20 is locked in place, each of the light-emitting diodes 30 is positioned immediately behind one of the transparent windows 31. Each of the transparent windows 31 contain an identification number or code number which assists in identifying the individual circuits.

Figure 1:
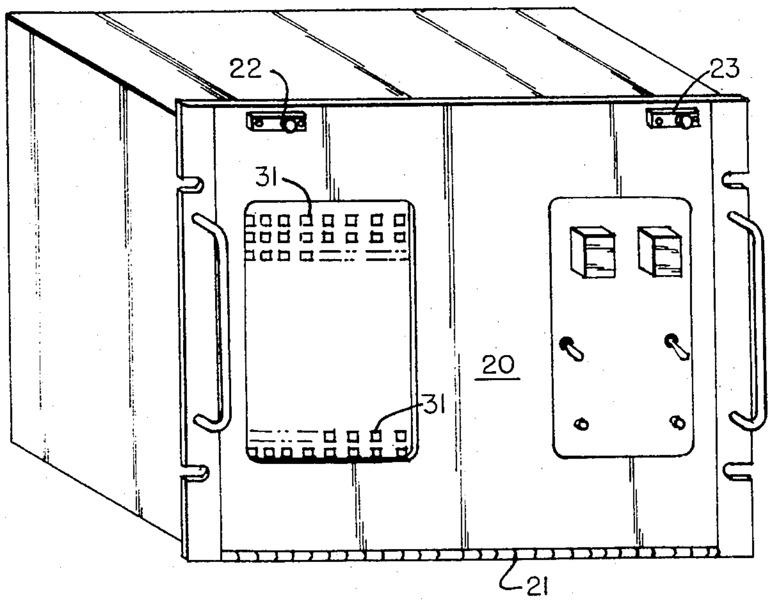
FIG. 1 is an isometric view of a cabinet for housing electronic circuitry together with the identification means for identifying specific circuit functions.

In one embodiment of the invention, a process control computer is housed within the cabinet 20. This computer is designed to perform the same control functions as a conventional relay logic system or solid state logic system. Information is accepted at the input level of the controller, analyzed, and the appropriate output commands provided. The input information may be in the form of voltage or current levels from such devices as limit switches, push buttons, photoelectric controls, or the like. Output commands are provided from the controller in the form of voltage or current signals capable of driving conventional solenoids, relays, lights and motor starters. The controller of the present invention has an input register, an output register, a central processing or computing unit, a memory system, and a scanner. As illustrated in FIGS. 1, 2 and 3, the process control computer would have registers and memories mounted on replaceable and removable circuit cards as illustrated in FIG. 2. The input register would be designated by the numeral 11, while the output register would be designated by the numeral 12. The replaceable and removable memory card is indicated by the numeral 13.

The input register 11 stores the electrical signals coming into the computer that are representative of the various perameters being controlled by the computer. Each of these register cards can handle up to 16 original input switches. If more than 16 sensors or command controls are involved, it is necessary only to add additional input registers to adapt the computer to its new environment.

Numeral 12 indicates the output register for a process control computer and in reality comprises two separate 16 bit registers. The first of these is a 16 bit temporary storage register which receives data from the processing unit, while the second is a 16 bit holding register. The output of the holding register is connected to 16 output converter circuits utilizing transformer isolated outputs to isolate the register from external loads.

Numeral 13 indicates the memory card for the embodiment comprising a process control computer. In the preferred embodiment, this is a read only memory card and it contains a master program which determines what decisions will be made based upon a unique set of input conditions. The program is stored in the memory by means of a diode matrix, and programming of the memory units is accomplished by opening a fuse link in series with the selected diode in the matrix.

As was previously noted, the register cards and the memory cards are replaceable and removable. As illustrated in FIG. 2, the cards are slidably engaged in a plurality of tracks 14 mounted in the lower portion of the cabinet. If it is desired to add additional register inputs it is only necessary to add an additional circuit board such as that illustrated by numeral 11. If it is desired to change the programming for the device, it is only necessary to insert a different memory board such as the circuit board illustrated by numeral 13. When register functions are changed due to a change in the memory, or due to the addition of additional registers, it is possible to provide an immediate indication of the function performed by any given register. Since the circuit boards or registers may be equipped with the light-emitting diodes, it is possible to verify a program which has been entered on the read only memory card 13 by applying a given input and watching for the appropriate response on the output register indicating means 30. If the computing device or its associated circuitry is malfunctioning, the indicating means 30 provides one method of isolating the malfunction. It is also possible by means of the identification means or code means 31 applied on the frontal face of cabinet 20 to preselect a given code number for an indicating means when the program is being written. This enables a programmer to write the program and to provide for an immediate method of checking the appropriate response of the computing device when the register cards and memory cards are installed in place. In conventional computing systems, the individual panel lights must be wired in place, and the wiring connections between the registers and the panel lights are quite costly and tedious. The identifying means mounted on the windows 31 are arranged in an octal system to the base 8. In the present invention, when an additional input or output register is required, and additional card is slid into place, the indicating means and the appropriate identifying means are already installed. There is no need to wire the individual panel lights to the new register members. The use of the indicating means 30 as an integral part in the input and output registers also assists in testing the register cards. When it is desired to check for a malfunction in an individual card, it is necessary only to remove the card and place it in a specially constructed test device. Since the signal lights have traveled with the card rather than remaining on the face of the computer panel, it is now possible to check each of the register inputs and outputs and obtain a verification from the indicating means 30.

Since the identifying means are mounted on the panel and not the circuit board, it is possible to remove the circuit board while the identifying means remain in the same place. If the board is defective, a new board may be slid into place. When the panel 20 is closed, each of the indicating means arranged on the circuit board are automaticly identified with the appropriate designation. No rewiring or relabling is required.

While the electronic means installed in the cabinet 20 has been illustrated in one embodiment as a process control computer, it is obvious that the invention is applicable to a wide number of circuit board applications. Such an illustration in the process control computer art is not means to be limiting, but only illustrative of the type of flexibility available with the cabinet and circuit board arrangement illustrated in the present invention.

We claim:

1. A cabinet for electronic circuitry comprising:

a. a plurality of guide means mounted within said cabinet;

b. a plurality of removable and replaceable circuit boards mounted in said guide means, each of said boards being slidably engaged therein, said boards also defining plural contact means for receiving at least one removable electrical connector;

c. a plurality of plural contact connectors arranged within said cabinet and removably mounted on said board, each of said connectors mating with a plural contact means on one of said boards;

d. removable closure means for said cabinet, said closure means having a registration means affixed thereto to cooperate with the guide means fixably aligning said board within said cabinet, said registration means abutting said connector and preventing any movement of said board and connector.

2. A cabinet as claimed in claim 1 wherein each of the circuit boards defines a plurality of indicating means arranged across the frontal edge of said board, said closure means also defining an opening for each of the indicating means mounted on said circuit board.

3. A cabinet as claimed in claim 2 wherein said cabinet openings are provided with an identification number, each of said indicating means being identified separately.

4. A cabinet as claimed in claim 3 wherein said closure means defines a front opening panel, said panel being hinged to the bottom of said cabinet and defining a pluality of openings for said indicating means within said front panel.

5. A cabinet as claimed in claim 4 wherein said cabinet means further comprise longitudinal tracks arranged with their longitudinal axis perpendicular to said front panel, said registration means including a horizontal means for engaging the panel edge of said removable circuit boards to thereby prevent any vertical movement or longitudinal movement along said perpendicular track.

6. A cabinet as claimed in claim 1 wherein said cabinet defines a hinged front panel and at least one track mounted within said cabinet with its axis perpendicular to the front panel, said tracks providing means receiving said circuit boards and preventing any horizontal movement thereof, said registration means being mounted on said front panel engaging said circuit boards and preventing any vertical or longitudinal movement thereof.

7. A cabinet as claimed in claim 6 wherein said registration means define a horizontal bar which engages a notch defined in the frontal edge of said removable connector.

8. A cabinet as claimed in claim 1 wherein each of the circuit boards further define a plurality of light-emitting diodes arranged vertically on the frontal edge of said circuit board.

9. A cabinet as claimed in claim 8 wherein said cabinet is equipped with a front panel, said panel defining a plurality of openings to display said diode means, each of said openings having means for identifying each of said diodes.

10. In a process control computer having an input register means, an output register means, a memory means and a computing means, the combination which comprises:

a. a cabinet having a plurality of guide means mounted therein;

b. a plurality of removable and replaceable register circuit boards mounted within said guide means and slidably engaged therein, said register boards having an input bus connection, a plural contact output bus connection for receiving a removable electrical connector, and a plurality of indicating means arranged across the frontal edge of said board, c. memory means also mounted on removable and replaceable circuit boards, said memory boards also slidably mounted within said guide means;

d. a plurality of plural contact bus connectors arranged within said cabinet and removably mounted on said register boards, said connectors mating with the plural contact means on said register boards, and e. removable closure means for said cabinet, said closure means having a registration means affixed thereto to cooperate with the guide means fixably aligning said boards within said cabinet, said registration means abutting said connector and preventing any movement of said board and connector.

11. A process control computer as claimed in claim 10 which further comprises at least one bus connector for connecting said register card to said computing means.

12. A process control computer as claimed in claim 10 wherein said cabinet has a front panel, said panel defining registration means which engage said register card and said bus connector to fixably align said card and said connector within said cabinet.

13. A process control computer as claimed in claim 10 wherein said cabinet means define an opening for each of the indicating means mounted on said register card.

14. A process control computer as claimed in claim 12 wherein said cabinet means has a front opening panel, said panel being hinged at the bottom of said cabinet and defining a plurality of openings for said indicating means within said front panel, each of said openings provided with an identification code whereby each of said indicating means are identified separately.

15. A process control computer as claimed in claim 12 wherein said cabinet means further comprise longitudinal tracks arranged with their longitudinal axis perpendicular to said front panel, said registration means including a horizontal means engaging the panel edge of said removable register boards and thereby prevent any vertical movement or longitudinal movement along said perpendicular track.

* * * * *